United States Patent
Lin et al.

(10) Patent No.: US 10,497,821 B2
(45) Date of Patent: Dec. 3, 2019

(54) THERMOPHOTOVOLTAIC ENERGY CONVERTER

(71) Applicant: Mitsubishi Electric Research Laboratories, Inc., Cambridge, MA (US)

(72) Inventors: Chungwei Lin, Boston, MA (US); Bingnan Wang, Belmont, MA (US); Koon Hoo Teo, Lexington, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 242 days.

(21) Appl. No.: 15/468,180

(22) Filed: Mar. 24, 2017

(65) Prior Publication Data

US 2018/0277699 A1    Sep. 27, 2018

(51) Int. Cl.
    *H01L 31/054*    (2014.01)
    *H01L 31/0216*    (2014.01)
    *H02S 10/30*    (2014.01)

(52) U.S. Cl.
    CPC ...... *H01L 31/054* (2014.12); *H01L 31/02167* (2013.01); *H02S 10/30* (2014.12); *Y02E 10/52* (2013.01)

(58) Field of Classification Search
    CPC .. H01L 31/054; H01L 31/02167; H02S 10/30
    See application file for complete search history.

(56) References Cited

U.S. PATENT DOCUMENTS

| | | |
|---|---|---|
| 9,368,667 B1 | 6/2016 | Kim et al. |
| 2009/0217977 A1 | 9/2009 | Florescu et al. |
| 2010/0031990 A1 | 2/2010 | Francoeur et al. |
| 2010/0319749 A1 | 12/2010 | Greiff et al. |
| 2011/0226317 A1 | 9/2011 | Xu et al. |
| 2011/0284059 A1* | 11/2011 | Celanovic ............ G05F 1/67 136/253 |

(Continued)

FOREIGN PATENT DOCUMENTS

| | | |
|---|---|---|
| WO | 2010008638 A2 | 1/2010 |
| WO | 20160081646 | 5/2016 |

OTHER PUBLICATIONS

Boriskina et al., "Plasmonic Materials for Energy, From Physics to Applications," Materials Today, vol. 16, No. 10, Oct. 1, 2013. pp. 375-386.

(Continued)

*Primary Examiner* — Jayne L Mershon
(74) *Attorney, Agent, or Firm* — Gene Vinokur; James McAleenan; Hironori Tsukamoto

(57) ABSTRACT

A thermophotovoltaic (TPV) energy converter includes a thermal emitter to generate photons of energy in response to receiving heat and a thermal receiver arranged at a distance from the thermal emitter. The thermal receiver includes a photovoltaic cell converting the received photons into electric energy. The thermal emitter includes a first layer of material arranged on a surface of the thermal emitter closest to the thermal receiver. The thermal receiver includes a second layer of material arranged on a surface of the thermal receiver closest to the thermal emitter. The first layer of material and the second layer of material have surface resonant frequencies above a bandgap of the photovoltaic cell.

17 Claims, 10 Drawing Sheets

(56) References Cited

U.S. PATENT DOCUMENTS

2015/0288318 A1    10/2015    Guler et al.

OTHER PUBLICATIONS

Bermel et al., "Tailoring Photonic Metamaterial Resonances for Thermal Radiation," Nanoscale Research Letters, vol. 6, No. 1, Jan. 1, 2011. pp. 549.

Molesky et al., "High Temperature Epsilon Near Zero and Epsilon Near Pole Metamaterial Emitters for Thermophotovoltaics," CLEO 2013, The Optical Society. Jun. 9, 2013. pp. 1-2.

* cited by examiner

THERMOPHOTOVOLTAIC ENERGY CONVERTER

TECHNICAL FIELD

This invention relates to a thermophotovoltaic (TPV) system, and more specifically to a TPV energy converter in the TPV system.

BACKGROUND

Thermophotovoltaic (TPV) energy conversion is a process of converting heat into electricity via photons. A basic TPV system includes a thermal emitter and a receiver that includes the photovoltaic (PV) cell (also commonly referred to as a solar cell). The emitter is kept at a certain (high) temperature by a heat source, and radiates photons to the PV cell. A PV cell is a semiconductor, characterized by a band gap $E_g$. When absorbing the emitter-radiated photons of energy larger than the band gap, electrons occupying the valence bands are excited to the conduction band, and become sources of an electric current.

The factors governing the TPV efficiency includes the number of photons emitted by the thermal emitter and the (energy) spectrum of photons absorbed by the PV cell. For a given emitter radiation spectrum, photons of low and high energies cannot be fully converted into the electric current: the low-energy photons, on the one hand, are wasted as they cannot generate conducting electrons; the high-energy photons, on the other hand, generates hot electrons which decays quickly to the conduction band bottom (via emitting phonons), and the net voltage is at most $V_g = E_g/|e|$. The ideal emitter spectrum is, therefore, a narrow-width spectrum peaked slightly above the band gap, with peak intensity as strong as possible.

To improve the TPV efficiency, the thermal emitter has to emit photons with energy higher than energy of the bandgap of the photovoltaic cell. Previous works, including U.S. Ser. No. 15/347,961, concentrate on designs of the thermal emitters that converts heat into radiation having surface resonant frequency tailored to the TPV systems. For example, for the near-field based TPV system, the emitter supports a few (at least one) resonant modes which are spatially localized, and the separation between the emitter and the PV cell is much shorter than the wavelength defined by the resonant modes. If fulfilled, the absorbed radiation spectrum is peaked at the resonant energies, with the peak intensity a few orders higher than the blackbody limit.

Generally, increasing the number of photons (whose energy is larger than $E_g$) absorbed by PV cell enhances the output electric power produced by the PV cell.

SUMMARY

It is an object of some embodiments to increase a number of photons (whose energy is larger than $E_g$) being absorbed by PV cell of the thermophotovoltaic (TPV) system thereby increasing the efficiency of the TPV system and/or to increase the electric power that PV cell can generate. Some embodiments are based on understanding that the reflection of the photons can be reduced by decreasing the separation between a thermal emitter and the PV cell, i.e., the less the separation, the more photons from the emitter can be absorbed by the PV cell. However, the thermal emitter needs to be sufficiently separated from the PV cell, because the emitter and the PV cell are kept at different temperatures. In other words, the distance between the emitter and the PV cell cannot be decreased indefinitely.

Some embodiments are based on realization that the absorptions of the photons in PV cell can be increased via "impedance matching" between the thermal emitter and thermal receiver including the PV cell. For example, electrical impedance is the measure of the opposition that a circuit presents to a current when a voltage is applied. In electronics, impedance matching is the practice of designing the input impedance of an electrical load and/or the output impedance of its corresponding signal source to maximize the power transfer from the source or minimize signal reflection from the load. The same principles apply to impedance matching for radiative energy transfer. In this case, the impedance matching is a function of surface resonance of the materials, which in turn is a function of dielectric properties of materials such as angular frequency and damping coefficients or bandwidth of the materials.

Some embodiments are based on recognition that the PV cell has a different material than the material of the thermal emitter, which results in poor impedance matching. To that end, some embodiments add a front layer at top of the PV cell of properties similar or exact to the properties of thermal emitter to match the impedance between the thermal emitter and the receiver.

Notably, adding the front layer goes against the conventional wisdom: it increases the distance between the emitter and PV Cell, and the front layer can absorb the photons that could have been absorbed by the PV cell. However, impedance matching overcompensates those disadvantages. By placing a thin front material, whose surface resonance is as close as to that of the emitter (ideally the same material as the emitter), the number of photons absorbed by the absorber is enhanced. This enhancement outweighs the disadvantages mentioned above.

Accordingly, one embodiment discloses a thermophotovoltaic (TPV) energy converter including a thermal emitter to generate photons of energy in response to receiving heat; and a thermal receiver arranged at a distance from the thermal emitter, the thermal receiver including a photovoltaic cell converting the received photons into electric energy, wherein the thermal emitter includes a first layer of material arranged on a surface of the thermal emitter closest to the thermal receiver, and wherein the thermal receiver includes a second layer of material arranged on a surface of the thermal receiver closest to the thermal emitter, and wherein the first layer of material and the second layer of material have surface resonant frequencies above a bandgap of the photovoltaic cell.

Another embodiment discloses a method for manufacturing a thermophotovoltaic (TPV) energy converter including a thermal emitter and a thermal receiver having a photovoltaic cell. The method includes selecting material and geometrical parameters of the thermal emitter, such that the thermal emitter converts incoming heat into radiation and has a surface resonant frequency above the bandgap of the photovoltaic cell; designing a front layer of the thermal receiver such that a surface resonant frequency of the front layer is above a bandgap of the photovoltaic cell; and manufacturing the TPV energy converter having the thermal emitter arranged at a distance from the thermal receiver, such that the designed front layer forms a surface of the thermal reliever closest to the thermal emitter.

DETAILED DESCRIPTION

Thermophotovoltaic (TPV) energy conversion involves the conversion of heat to electricity, and has been identified as a promising technology since the 1960's. An exemplar TPV system includes a thermal emitter and a thermal receiver. The thermal emitter is typically a piece of solid material or a specially engineered structure that generates thermal emission when heated to a high temperature (i.e., typically in a range from about 1200° K to about 1500° K). Thermal emission is the spontaneous radiation (emission) of photons due to thermal motion of charges in the thermal emitter material. For normal TPV system operating temperatures, the radiated photons are mostly at near infrared and infrared frequencies. The thermal receiver includes a photovoltaic (PV) cell positioned to absorb some of these radiated photons, and is constructed to convert the absorbed photons into free charge carriers (i.e., electricity) in the manner typically associated with the solar cells. The thermal emitter can be solid structure that is heated from an external source (e.g., by concentrated sunlight or other heat generator).

Figure 1:
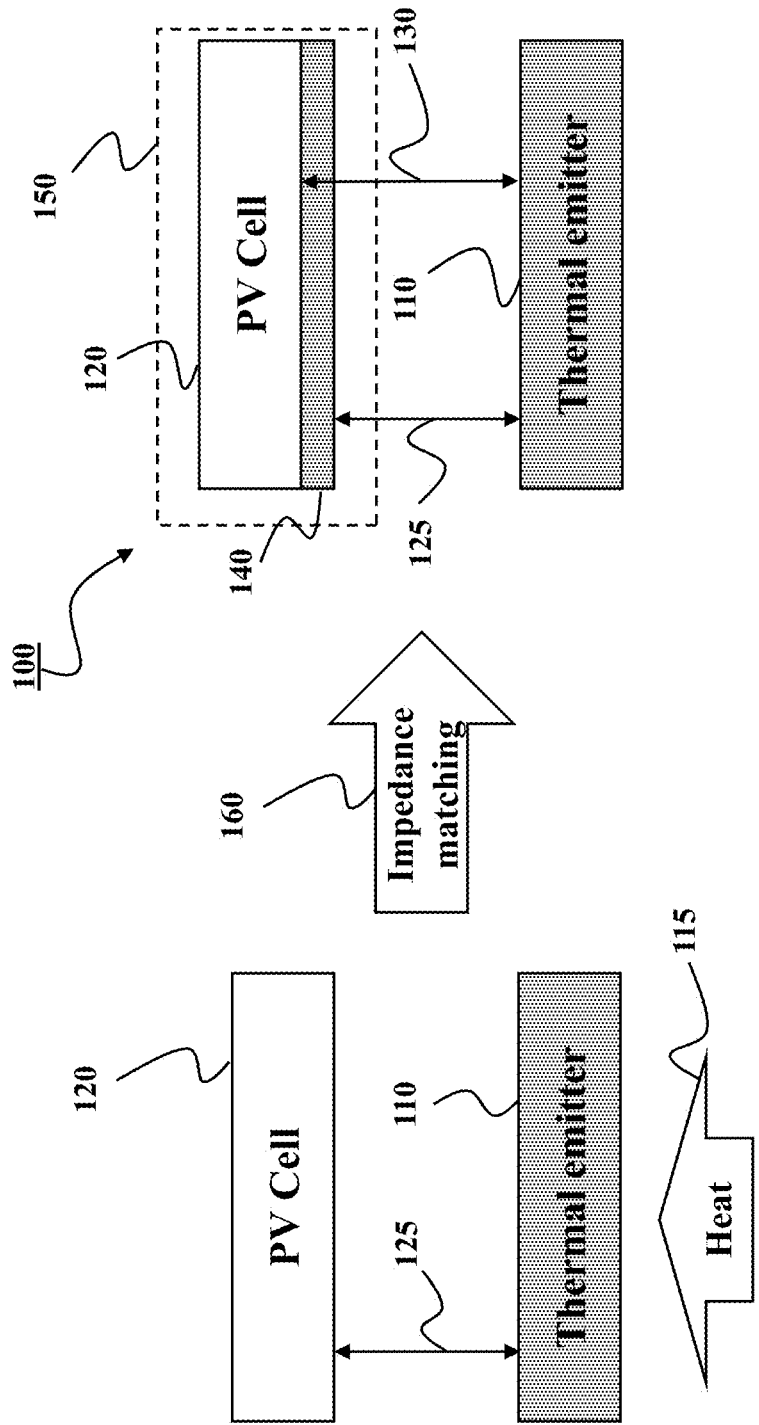
FIG. 1 shows a schematic of a TPV system according to some embodiments.

FIG. 1 shows a schematic of a TPV system according to some embodiments. The TPV system includes a source of heat 115, a thermal emitter 110 for converting the heat from the heat source 115 into radiation, and a photovoltaic cell 120 arranged at a distance 125 from the thermal emitter 110 for converting the radiation into electricity. Examples of the heat source 115 include radiation from sun, as well as combustion, nuclear, and other energy sources.

The operation of TPV is based on photovoltaic (PV) principle, but the direct radiation energy comes from a high temperature (1000-2000K) emitter. To that end, some embodiments use refractory metals, such as tungsten, as emitter materials. For example, in PV system, the solar cell directly receives radiation energy from the sun. Distance 125 between the emitter and TPV cell is ~μm to cm, while in PV system, the solar cell is millions of miles away from the sun. To that end, the radiation intensity from the emitter in TPV is much higher than that from the sun in PV system due the close distance between the emitter and TPV cell, although the emitter temperature is much lower than the sun temperature. Also, the PV system can only use part of solar radiation, where only photons with energy higher than the bandgap of the solar cell can be converted into electron-hole pairs, other low energy photons are useless. However, with a proper spectral control system in TPV, photons with energy below semiconductor band gap can be reflected back to the emitter to recycle. To that end, with the proper the spectral control, potential efficiency of TPV system is much higher than PV system.

In particular, if a TPV emitter is an ideal blackbody emitter, a significant amount of emission power is wasted, since photons with energy below the bandgap of the PV cell ($E_g$ with corresponding wavelength $\lambda_g = hc/E_g$, where h is Planck's constant, c is the speed of light.) cannot generate electron-hole pairs. Accordingly, in some embodiments, the thermal emitter 110 is designed to emit photons with energy higher than PV cell bandgap as much as possible, and to emit photons with energy lower than PV cell bandgap as little as possible.

However, when photons with the right energy higher than its bandgap $E_g$ hit the PV cell 120, some of photons are reflected back and only part of them are absorbed by PV cell to generate electrons and holes. In some embodiments, the thermal emitter is separated from the thermal receiver by vacuum. Additionally, or alternatively, a distance 125 between the thermal emitter and the thermal receiver is in an order of nanometers (nm).

The photons absorbed by the PV cell can be enhanced by decreasing the separation 125 between a thermal emitter and the PV cell, i.e., the less the separation, the more photons from the emitter can be absorbed by the PV cell. However, the thermal emitter needs to be sufficiently separated from the PV cell so that the emitter and the PV cell can be fixed at different temperatures, i.e., the distance between the emitter and the PV cell cannot be decreased indefinitely.

Some embodiments are based on realization that the absorptions of the photons in PV cell can be increased via "impedance matching" 160 between the thermal emitter 125 and thermal receiver 150 including the PV cell 120. For example, electrical impedance is the measure of the opposition that a circuit presents to a current when a voltage is applied. In electronics, impedance matching is the practice of designing the input impedance of an electrical load and/or the output impedance of its corresponding signal source to maximize the power transfer from the source or minimize signal reflection from the load. The concept of impedance matching also applies to the radiative energy transfer. In this case, the impedance matching is a function of surface resonance of the materials, which in turn is a function of dielectric properties of materials such as angular frequency and damping coefficients or bandwidth of the materials.

Some embodiments are based on recognition that the PV cell has a different material than the material of the thermal emitter, which results in poor impedance matching. This is because the material of PV cell and the material of the thermal emitter are designed for different purposes. To that end, some embodiments add a front layer 140 at the PV cell with properties similar or exact to the properties of thermal emitter to match the impedance between the thermal emitter 110 and the receiver 150.

Notably, adding the front layer goes against the conventional wisdom: it increases the distance 130 between the emitter and PV Cell, and the front layer can absorb the photons that could have been absorbed by the PV cell. However, the impedance matching overcompensates those disadvantages. By placing a thin front material, whose surface resonance is as close as to that of the emitter (ideally the same material as the emitter), the number of photons absorbed by the absorber is enhanced. This enhancement outweighs the disadvantages mentioned above.

To that end, in some embodiments, a TPV energy converter 100a thermal emitter 110 to generate photons of energy and a thermal receiver 150 arranged at a distance from the thermal emitter. The thermal receiver includes a photovoltaic cell 120 converting the received photons into electric energy. The thermal emitter includes a first layer of material arranged on a surface of the thermal emitter 110 closest to the thermal receiver. In some implementations, the thermal emitter is a monolithic structure, and the first layer is formed by the entire thermal emitter 110. In alternative embodiments, the thermal emitter is a layered structure, and the first layer is the layer closest to the thermal receiver 150.

The thermal receiver 150 includes a second layer 140 of material arranged on a surface of the thermal receiver closest to the thermal emitter. To that end, the second layer is also referred herein as a front layer or as the front layer of the thermal receiver. The second layer is designed to provide impedance matching 160 between the thermal emitter and the thermal receiver. To that end, both the first layer of material and the second layer of material have a surface resonant frequency above a bandgap of the photovoltaic cell.

Figure 2:
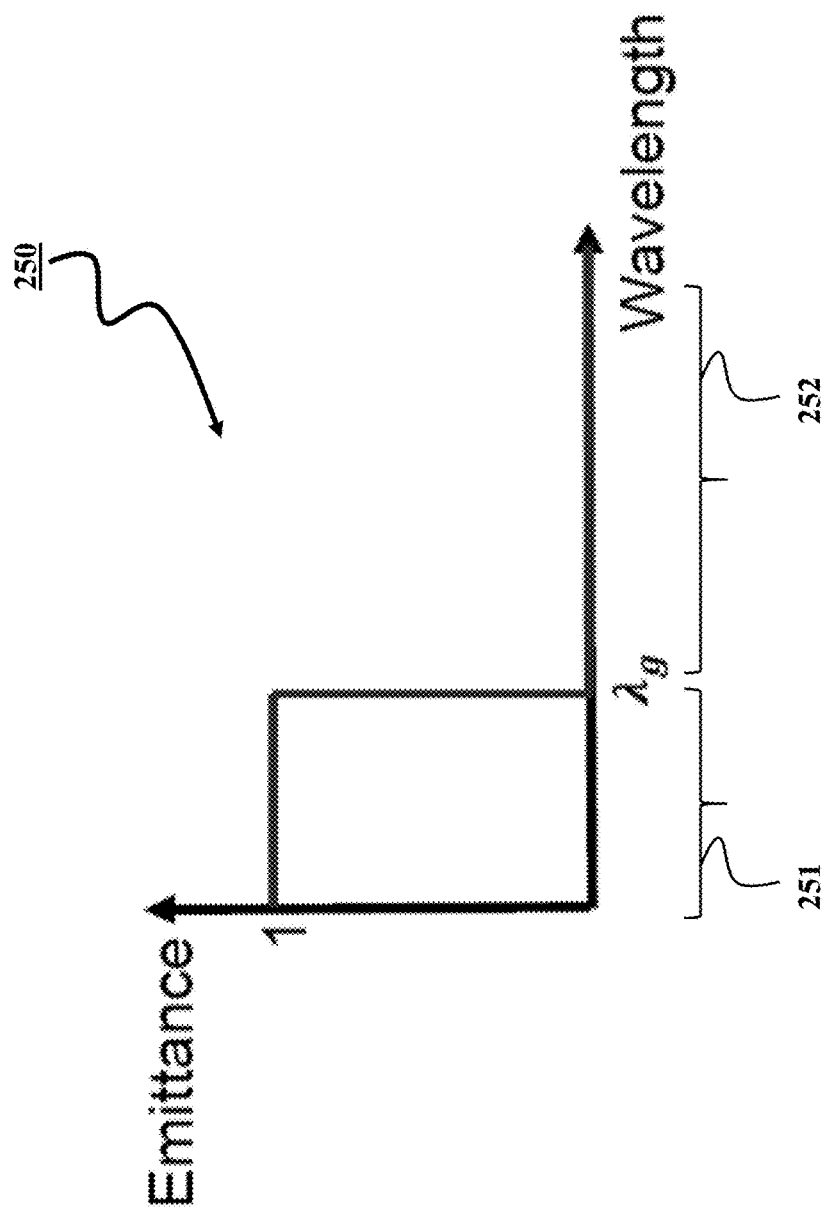
FIG. 2 shows a plot of an optimal emittance curve of a thermal emitter tailored for TPV application.

FIG. 2 shows a plot of an optimal emittance curve 250 of a thermal emitter tailored for TPV application. The optimal emittance curve 250 follows a step function with a high emittance zone 251 having spectrum that at least ideally equals to one for wavelength shorter than $\lambda_g$ and a low emittance zone 252 having spectrum that at least ideally equals to zero for wavelength longer than $\lambda_g$. To that end, in some embodiments, the structure and the material of the thermal emitter are selected to approximate the curve 250, and the material and the structure of the second layer 140 are selected to match the impedance with the thermal emitter.

Figure 3:
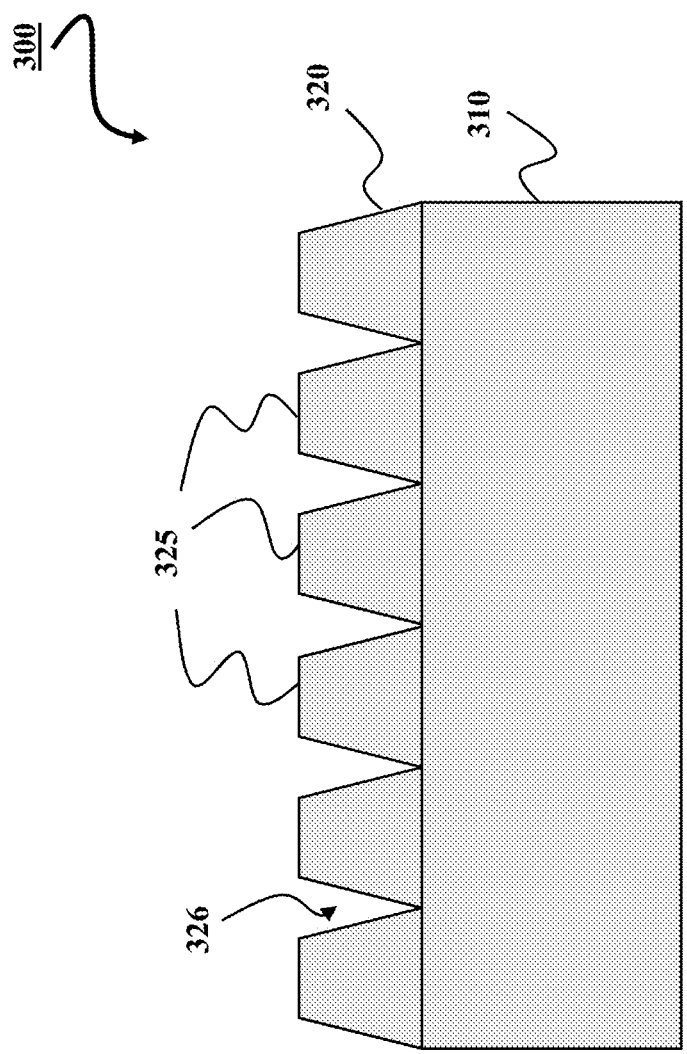
FIG. 3 shows a schematic of a thermal emitter according to one embodiment.

FIG. 3 shows a schematic of a thermal emitter 300 according to one embodiment. The thermal emitter 300 includes a substrate 310 and a grating 320 arranged atop the substrate. The grating 320 includes a plurality of equidistant structures 325. In this example, the cross-section of the structure 325 has a trapezoid shape, e.g., the equidistant structures 325 in the grating 320 are separated by grooves 326 of triangular profile. In alternative embodiments, different profiles of the gratings are used.

Some embodiments are based on recognition that grating can significantly enhance emission compared with flat tungsten surface owing to several physical mechanisms, including cavity resonances, propagating surface plasmon polaritons, and localized surface plasmon resonances (LSPRs). LSPRs can be excited at both vertical and horizontal metal-dielectric boundaries, and the resonant frequencies can be tuned via the geometrical design. Moreover, the nanostructures to support LSPRs can be made to be subwavelength; therefore, more resonances can be excited within the same area, creating stronger absorption effect.

In the thermal emitter 300, the first layer is formed by the grating 320 and/or by the combination of the substrate 310 and the grating 320 if such a combination is monolithic. In alternative embodiments other layered structures of thermal emitter are used.

Figure 4:
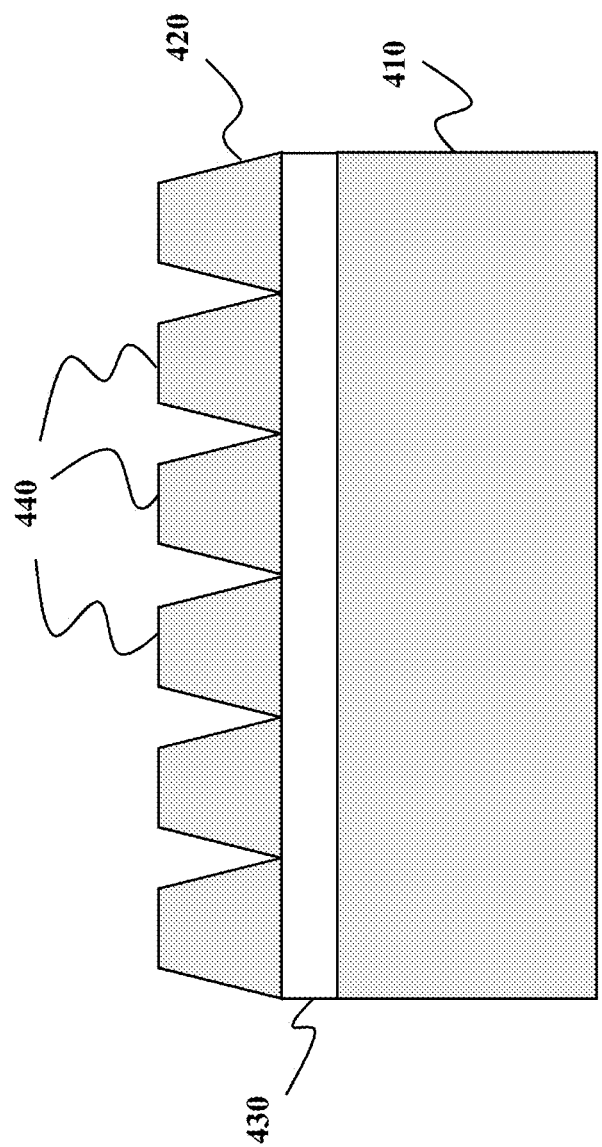
FIG. 4 shows a schematic of a thermal emitter that includes a dielectric layer according to another embodiment.

FIG. 4 shows a schematic of a thermal emitter according another embodiment that includes a dielectric layer 430 arranged between the grating 420 and the substrate 410 of the thermal emitter. For example, the dielectric layer 430 can include SiO2 (silicon dioxide). The dielectric layer 430 supports additional resonant mode of excitation thereby increasing the length of the high emittance zone of the emitted spectrum. In this embodiment, the first layer is the layer formed by the grating 440.

Figure 5:
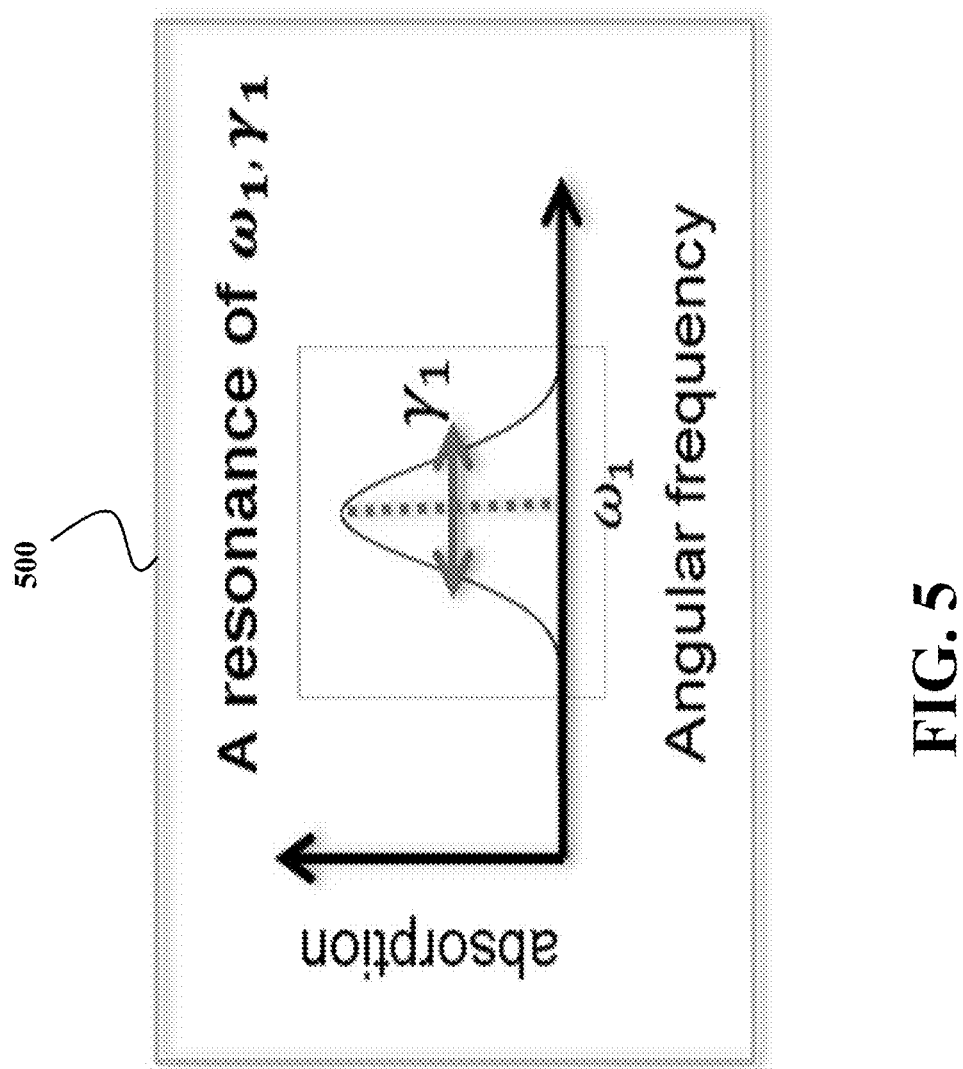
FIG. 5 shows a graph illustrating that the absorption of the photons depends on a surface resonant frequency.

FIG. 5 shows a graph 500 illustrating that the absorption of the photons depends on a surface resonant frequency of the materials of the thermal emitter and/or the thermal receiver. Some embodiments are based on recognition from Maxwell equations and quantum mechanics that for two materials supporting surface resonance characterized by $\omega_1$, $\gamma_1$ and $\omega_2$, $\gamma_2$, respectively, wherein ω is the resonant energy and γ is the corresponding decay rate, the energy transfer between the materials, i.e., the absorption of photons, increases when $\omega_1=\omega_2$ and $\gamma_1=\gamma_2$.

To that end, in some embodiments, the surface resonant frequency of the first layer is identical to the surface resonant frequency of the second layer. For example, in one implementation of this embodiment, the material of the first layer is identical to the material of the second layer to simplify the impedance matching. However, in alternative embodiments this requirement is relaxed to simplify the design of the TPV converter. In those embodiments, the surface resonant frequencies of the first and the second layers are close to each other, but not exact.

For example, in one embodiment, the bandwidth of the surface resonant frequency of the first layer intersects the bandwidth of the surface resonant frequency of the second layer. For example, the difference between the surface resonant frequency of the first layer and the surface resonant frequency of the second layer is less than a threshold. For example, the threshold can be defined as a function of damping coefficients of one or combination of the materials of the first layer and the second layer.

Figure 6A:
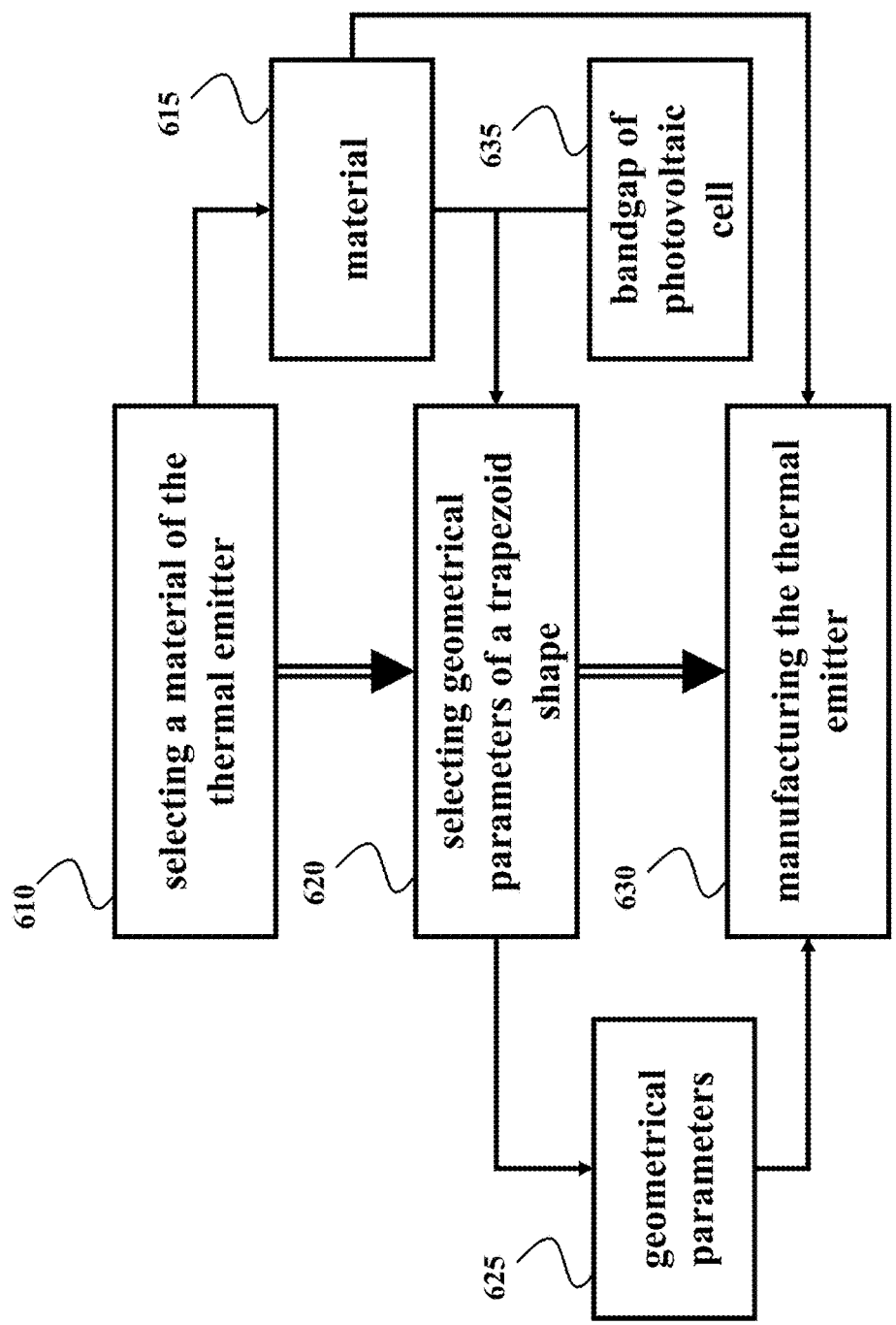
FIG. 6A shows a block diagram of a method for manufacturing a thermal emitter according to one embodiment.

FIG. 6A shows a block diagram of a method for manufacturing a thermal emitter for forming a TPV system including the thermal emitter and a photovoltaic cell according to one embodiment. The method selects 610 a material 615 of the thermal emitter. An example of the material 615 includes tungsten due to its thermal resistance.

The method selects 620 geometrical parameters 625 of a trapezoid shape based on a function of a bandgap of the photovoltaic cell 635, such that the geometrical parameters and the material of the thermal emitter are selected to emit the radiation having wavelengths shorter than λg determined according to $\lambda_g=hc/E_g$, where h is the Planck constant, c is the speed of light, and $E_g$ is energy below the bandgap of the photovoltaic cell. Next, the thermal emitter is manufactured 630 using the material 615 to include a substrate and a grating including a plurality of equidistant structures with the shape having a non-rectangular cross-section forming the trapezoid shape with the geometrical parameters.

In different embodiments, the calculations of the method of FIG. 6A are performed using a processor. For example, the processor can be used for plotting the emittance curve and/or for the simulating the performance of the thermal emitter. The manufacturing 630 can be performed, e.g., by depositing the thin dielectric layer on top of substrate, and fabricating the grating layer first by depositing a thin film and then go through photolithography and etching steps to form the grating pattern.

Figure 6B:
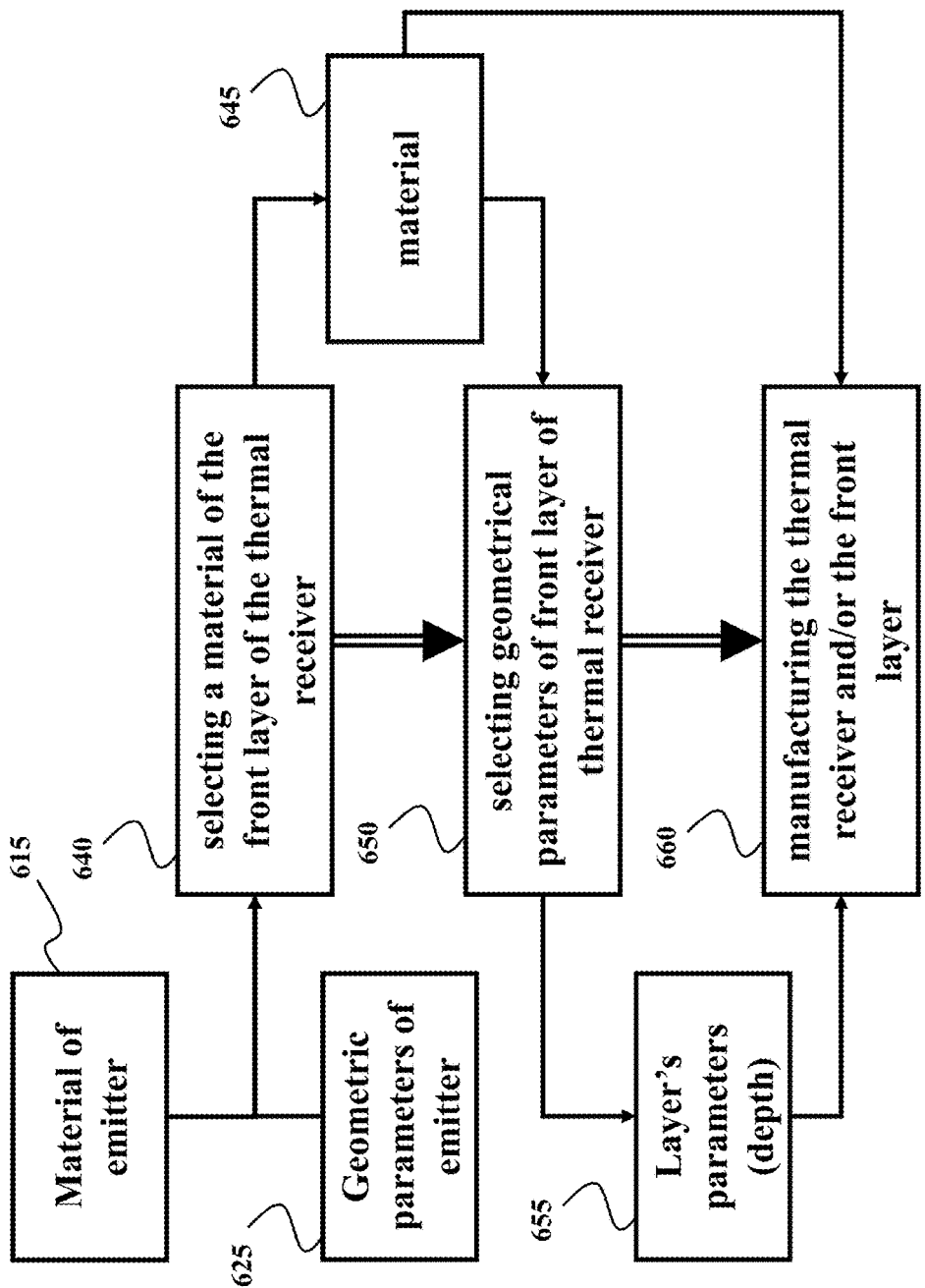
FIG. 6B shows a block diagram of a method for manufacturing a thermal receiver and/or a front layer of the thermal receiver for forming a TPV system including the thermal emitter of FIG. 6A according to one embodiment.

FIG. 6B shows a block diagram of a method for manufacturing 660 a thermal receiver and/or a front layer of the thermal receiver for forming a TPV system including the thermal emitter of FIG. 6A according to one embodiment. The embodiment selects the material of the front layer of the thermal receiver based on the material 615 and/or geometrical parameters 625 of the thermal emitter 110 to design the front layer having the surface resonant frequency similar to the surface resonant frequency of the front layer of the thermal emitter.

For example, the embodiment can select 640 the material 645 identical to the material 615 and determine 650 the thickness 655 of the front layer of the thermal emitter optimized for the design of the thermal receiver to increase the absorption of the photon and improve the energy transfer. For example, in one embodiment, the depth of the second layer of the thermal receiver is less than the wavelength of the surface resonant frequency of the first layer of the thermal emitter and/or the second layer of the thermal receiver. The manufacturing 660 can be performed in a manner similar to the manufacturing 660. In one embodiments, the TPV converter is manufactured concurrently as one device.

Exemplar Design Parameters of TPV Converters

Some embodiments are based on recognition that for the materials arranged in a layered configuration the radiative heat transfer between the materials can be computed using the dyadic Green and the random current source obeying the fluctuation-dissipation theorem. For the planar structure, where the in-plane momentum K (defines x-y plane) is a good quantum number, the Poynting vector normal to the plane as a function z has the form $$S_z(z) = \int_0^\infty \frac{d\omega}{2\pi} \hbar\omega[\Theta_i(\omega) - \Theta_j(\omega)] \frac{A}{(2\pi)^2} \int d^2K \varepsilon(\omega, K; z) \quad (1)$$

$$\frac{S_z}{A} = \int_0^\infty \frac{d\omega}{2\pi} \hbar\omega[\Theta_i(\omega) - \Theta_j(\omega)] \frac{(2\pi)}{(2\pi)^2} \int k dk \varepsilon(\omega, k; z)$$

Here $\Theta_i(\omega) = [e^{\hbar\omega/(k_B T_i)} - 1]^{-1}$ is the Planck distribution, A is the surface area of the emitter, $k_B$ is the Boltzmann constant, $k = |K|$, and $\varepsilon(\omega, k; z)$ is a dimensionless function determined by the spatial configuration. Some embodiments compute Eq. (1) exactly to design and test the effectiveness of the TPV converters.

For example, one embodiment considers the emitter whose dielectric function can be described by the Lorentz oscillator model corresponding to BN (Boron Nitride) as $$\varepsilon_L(\omega) = \varepsilon_\infty \frac{\omega^2 - \omega_{LO}^2 + i\gamma\omega}{\omega^2 - \omega_{TO}^2 + i\gamma\omega}$$

with $\varepsilon_\infty = 4.46$. $\omega_{LO}$ and $\omega_{TO}$ are frequencies of longitudinal and transverse optical modes. All frequencies are measured in $\omega_{LO} = \overline{\omega}_{LO} \equiv 0.1616$ eV with $\omega_{TO}/\omega_{LO} = 0.81$, $\gamma/\omega_{LO} = 0.0041$, $\overline{k}_{LO} = \overline{\omega}_{LO}/c$. For the PV cell, the dielectric function is governed by the direct valence-to-conduction interband transition.

The radiative energy transfers between the emitter and the absorber originates from their coupling to the common resonant modes of the TPV system. If only emitter/vacuum subsystem sustains a resonant mode, then the design principle is to make system resonance have the decay rate to the emitter as close as possible to decay rate to the absorber. This "impedance matching" condition maximizes the radiation energy transfer. As the decay rate is related to the loss and is more difficult to control, some embodiments do not consider optimizing the system of single resonance. If both the emitter/vacuum and vacuum/absorber subsystems sustain their respective resonant mode (so there are two resonant modes of the whole system), the maximum radiation transfer happens when the real part complex eigenenergies of these two subsystems are close in values for the largest possible K range, which is served as the design principle. The symmetric emitter-vacuum-emitter configuration satisfies this criterion.

Figure 7A:
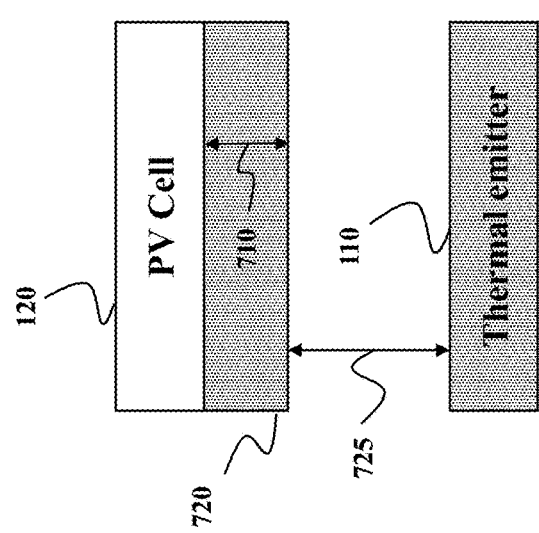
FIG. 7A shows a schematic of a symmetric TPV converter according to one embodiment.

FIG. 7A shows a schematic of a symmetric TPV converter according to one embodiment. The material of the layers thermal emitter 110 is identical to the material of the front layer 720 of the thermal receiver. The layer 720 is separated by vacuum from the emitter 110 and arranged at the distance 725 equals, e.g., 10 nm. To that end, the TPV converter of FIG. 7A can be referred as emitter-vacuum (10 nm)-front material-PV configuration.

Figure 7B:
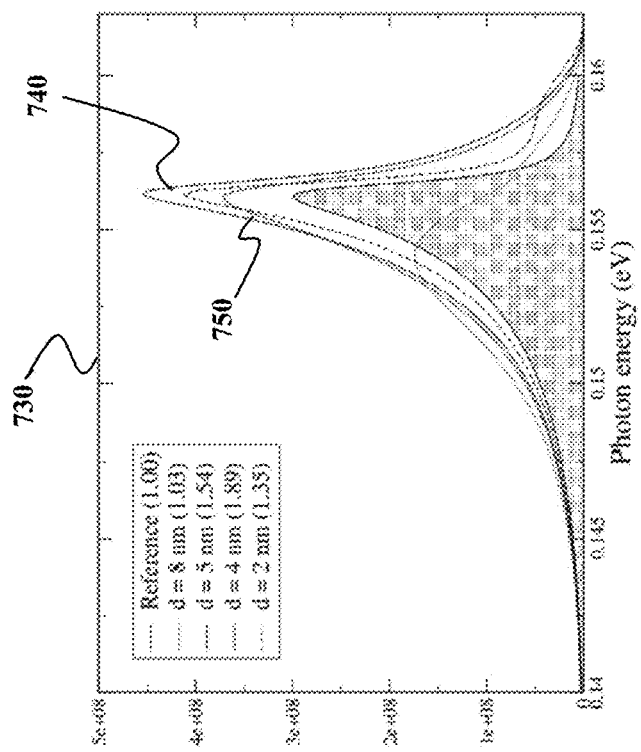
FIG. 7B shows a radiation power spectrum absorbed by the PV cell of the TPV converter of FIG. 7A for different values of thickness or depth of the front layer determined by some embodiments.

FIG. 7B shows a radiation power spectrum 730 absorbed by the PV cell of the PTV converter of FIG. 7A for different values of thickness or depth 710 of the layer 720 determined by some embodiments. For example, a plot 740 corresponds to the depth of 4 nm of the layer 720 while the plot 750 corresponds to the depth of 5 nm. The front material is chosen the same as the emitter, and there exists an optimal thickness, around 4 nm, where the PV absorbed power is maximized. To that end, some embodiments test efficiency of the TPV system for different values of the depth of the front layer of the thermal emitter and select a value of the depth of the front layer maximizing efficiency of converting the received photons into the electric energy relative to other values of the depth of the front layer.

Figure 8:
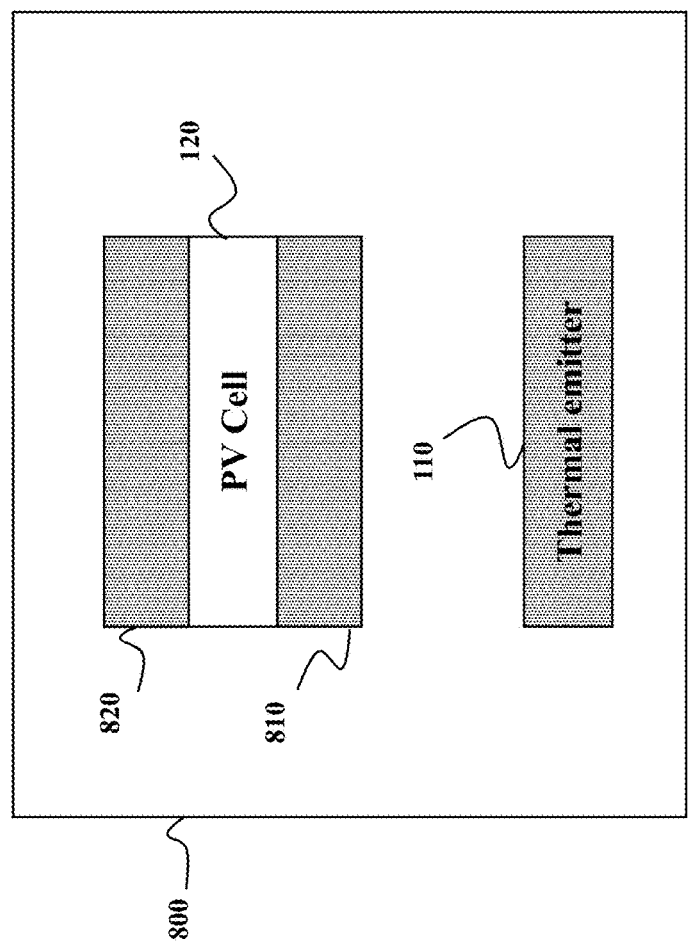
FIG. 8 shows a schematic of a TPV converter according to another embodiment.

FIG. 8 shows a schematic of a TPV converter according to another embodiment. In this embodiment, a receiver of the TPV converter 800 includes both the front layer 810 and a back layer 820. The material of the back layer 820 can be the same or different from the material of the front layer 810. The back layer 820 can further improve energy efficiency of the TPV converter.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format.

Although the disclosure has been described by way of examples and embodiments, it is to be understood that various other adaptations and modifications can be made within the spirit and scope of the invention. Therefore, it is the object of the appended claims to cover all such variations and modifications as come within the true spirit and scope of the invention.

We claim:

1. A thermophotovoltaic (TPV) energy converter, comprising:
    a thermal emitter to generate photons of energy in response to receiving heat; and
    a thermal receiver arranged at a distance from the thermal emitter, the thermal receiver including a photovoltaic cell converting the received photons into electric energy,
    wherein the thermal emitter includes a first layer of material arranged on a surface of the thermal emitter closest to the thermal receiver, and wherein the thermal receiver includes a second layer of material arranged on a surface of the thermal receiver closest to the thermal emitter, wherein the thermal receiver includes a third layer of material arranged on a surface of the thermal receiver furthest to the thermal emitter, wherein the third layer of material has a surface resonant frequency above a bandgap of the photovoltaic cell, and wherein the first layer of material and the second layer of material have surface resonant frequencies above a bandgap of the photovoltaic cell.

2. The TPV energy converter of claim 1, wherein the surface resonant frequency of the first layer is identical to the surface resonant frequency of the second layer.

3. The TPV energy converter of claim 1, wherein a difference between the surface resonant frequency of the first layer and the surface resonant frequency of the second layer is less than a threshold defined as a function of damping coefficients of one or combination of the materials of the first layer and the second layer.

4. The TPV energy converter of claim 1, wherein the bandwidth of the surface resonant frequency of the first layer intersects the bandwidth of the surface resonant frequency of the second layer.

5. The TPV energy converter of claim 1, wherein the material of the first layer is identical to the material of the second layer.

6. The TPV energy converter of claim 1, wherein the depth of the second layer is less than the wavelength of the surface resonant frequency of the first layer and the second layer.

7. The TPV energy converter of claim 1, wherein the material of the third layer is identical to the material of the second layer.

8. The TPV energy converter of claim 1, wherein the material of the third layer is different from the material of the second layer.

9. The TPV energy converter of claim 1, wherein the thermal emitter is separated from the thermal receiver by vacuum.

10. The TPV energy converter of claim 1, wherein the distance between the thermal emitter and the thermal receiver is in an order of nanometers (nm).

11. The TPV energy converter of claim 1, wherein the thermal emitter comprises:
a substrate; and
a grating arranged atop the substrate to form the first layer.

12. The TPV energy converter of claim 11, wherein the grating includes a plurality of equidistant structures having a cross-section with a trapezoid shape.

13. The TPV energy converter of claim 11, further comprising:
a dielectric layer arranged between the grating and the substrate.

14. The TPV energy converter of claim 1, wherein geometrical parameters and the material of the thermal emitter are selected to emit the radiation having wavelengths shorter than $\lambda_g$ determined according to $\lambda_g = hc/E_g$, where h is the Planck constant, c is the speed of light, and $E_g$ is bandgap energy of the photovoltaic cell.

15. A method for manufacturing a thermophotovoltaic (TPV) energy converter including a thermal emitter and a thermal receiver having a photovoltaic cell, comprising:
selecting material and geometrical parameters of the thermal emitter, such that the thermal emitter converts incoming heat into radiation and has a surface resonant frequency above a bandgap of the photovoltaic cell;
designing a front layer of the thermal receiver having a surface resonant frequency above a bandgap of the photovoltaic cell;
manufacturing the TPV energy converter having the thermal emitter arranged at a distance from the thermal receiver, such that the designed front layer forms a surface of the thermal reliever closest to the thermal emitter; and
adding a third layer of material arranged on a surface of the thermal receiver furthest to the thermal emitter, wherein the third layer of material has a surface resonant frequency above a bandgap of the photovoltaic cell.

16. The method of claim 15, wherein the designing comprises:
selecting the material of the front layer such that the bandwidth of the surface resonant frequency of the first layer intersects the bandwidth of the surface resonant frequency of the second layer.

17. The method of claim 15, wherein the designing comprises:
selecting a value of the depth of the front layer maximizing efficiency of converting the received photons into the electric energy relative to other values of the depth of the front layer.

* * * * *